US011300600B2

(12) United States Patent
Defenbaugh et al.

(10) Patent No.: US 11,300,600 B2
(45) Date of Patent: Apr. 12, 2022

(54) ARC ZONE FAULT DETECTION

(71) Applicant: Hamilton Sundstrand Corporation, Charlotte, NC (US)

(72) Inventors: John F. Defenbaugh, Rockford, IL (US); Jef William Good, German Valley, IL (US); Joshua Berg, Roscoe, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 16/822,230

(22) Filed: Mar. 18, 2020

(65) Prior Publication Data

US 2021/0293871 A1 Sep. 23, 2021

(51) Int. Cl.
*G01R 31/08* (2020.01)
*B64F 5/60* (2017.01)
*G01R 31/00* (2006.01)
*G01R 31/12* (2020.01)

(52) U.S. Cl.
CPC .......... *G01R 31/08* (2013.01); *B64F 5/60* (2017.01); *G01R 31/008* (2013.01); *G01R 31/12* (2013.01)

(58) Field of Classification Search
CPC ...... G01R 31/08; G01R 31/008; G01R 31/12; B64F 5/60
USPC ..................................................... 324/503
See application file for complete search history.

(56) References Cited

U.S. PATENT DOCUMENTS

| | | | |
|---|---|---|---|
| 9,476,931 B2 * | 10/2016 | Sun | G01R 31/086 |
| 9,746,512 B2 | 8/2017 | Shipley | |
| 10,114,057 B2 | 10/2018 | Beierschmitt et al. | |
| 10,352,984 B2 | 7/2019 | Thomas et al. | |
| 10,422,826 B2 | 9/2019 | Handy | |
| 2006/0044710 A1 | 3/2006 | Beneditz et al. | |
| 2012/0139550 A1 | 6/2012 | Gillis et al. | |
| 2013/0286515 A1 | 10/2013 | White et al. | |
| 2015/0103447 A1 | 4/2015 | Brouwer et al. | |
| 2016/0091555 A1 * | 3/2016 | Drouere | G01R 25/00 702/59 |
| 2020/0021111 A1 * | 1/2020 | White | H02J 3/001 |
| 2020/0028349 A1 | 1/2020 | Elliott | |

FOREIGN PATENT DOCUMENTS

| | | |
|---|---|---|
| EP | 2860834 A2 | 4/2015 |
| EP | 2860840 A1 | 4/2015 |

OTHER PUBLICATIONS

European Search Report issued in European Application No. 21160281.8; Application Filing Date Mar. 2, 2021; dated Aug. 12, 2021 (7 pages).

\* cited by examiner

*Primary Examiner* — Farhana A Hoque
(74) *Attorney, Agent, or Firm* — Cantor Colburn LLP

(57) ABSTRACT

In accordance with one or more embodiments, a system is provided. The system includes feeders, sensors, and a controller. The feeders connect a panel to a generator and a load. The sensors are on the feeders. The controller receives sensor signals from the sensors. The controller evaluates the sensor signals to determine a fault location.

16 Claims, 3 Drawing Sheets

ARC ZONE FAULT DETECTION

BACKGROUND

Exemplary embodiments pertain to the art of arc zone fault detection.

In general, conventional aircraft electrical systems include a differential protection circuit to safeguard against short circuits in a wing of an aircraft. However, in these conventional aircraft electrical systems, arc faults in an electrical panel or wiring to the loads of the aircraft can cause an erroneous trip (e.g., an arc fault in the panel or downstream to the loads) of the differential protection circuit due to circuit saturation. As the differential protection circuit isolates the arc faults to a generating channel, the conventional aircraft electrical systems then enable other sources to connect to the arc fault, thereby causing a cascading loss of sources.

BRIEF DESCRIPTION

In accordance with one or more embodiments, a system is provided. The system includes one or more feeders, one or more sensors, and a controller. The one or more feeders connect a panel to a generator and a load. The one or more sensors are on the one or more feeders. The controller receives one or more sensor signals from the one or more sensors. The controller evaluates the one or more sensor signals to determine a fault location.

In accordance with one or more embodiments or the system embodiment above, the controller can determine the fault location by dividing a voltage at the point of regulation by a current on a line associated with the point of regulation to determine an impedance that reflects the fault location.

In accordance with one or more embodiments or any of the system embodiments above, the controller can differentiate between a fault upstream of a generator line contactor in the panel and a fault downstream of the generator line contactor.

In accordance with one or more embodiments or any of the system embodiments above, the controller can evaluate and combine the one or more sensor signals with a trip signal to determine the fault location.

In accordance with one or more embodiments or any of the system embodiments above, the one or more feeders can include one or more generator feeders connecting the panel to the generator.

In accordance with one or more embodiments or any of the system embodiments above, the one or more sensors can include one or more current sensors, each of which is associated with the one or more generator feeders.

In accordance with one or more embodiments or any of the system embodiments above, the one or more feeders can include one or more panel feeders connecting the panel to the load.

In accordance with one or more embodiments or any of the system embodiments above, the one or more sensor signals can include a panel current sensor signal, a voltage point of regulation sensor signal, and a generator current sensor signal.

In accordance with one or more embodiments or any of the system embodiments above, the controller can include a generator controller.

In accordance with one or more embodiments or any of the system embodiments above, the generator and the one or more generator feeders can be located on a wing of an aircraft.

In accordance with one or more embodiments, a method is provided. The method includes receiving, by a controller, one or more sensor signals from one or more sensors configured on the one or more feeders connecting a panel to a generator and a load. The method also includes evaluating, by the controller, the one or more sensor signals to determine a fault location.

In accordance with one or more embodiments or the method embodiment above, the controller can determine the fault location by dividing a voltage at the point of regulation by a current on a line associated with the point of regulation to determine an impedance that reflects the fault location.

In accordance with one or more embodiments or any of the method embodiments above, the controller can differentiate between a fault upstream of a generator line contactor in the panel and a fault downstream of the generator line contactor.

In accordance with one or more embodiments or any of the method embodiments above, the controller can evaluate and combine the one or more sensor signals with a trip signal to determine the fault location.

In accordance with one or more embodiments or any of the method embodiments above, the one or more feeders can include one or more generator feeders connecting the panel to the generator.

In accordance with one or more embodiments or any of the method embodiments above, the one or more sensors can include one or more current sensors, each of which is associated with the one or more generator feeders.

In accordance with one or more embodiments or any of the method embodiments above, the one or more feeders can include one or more panel feeders connecting the panel to the load.

In accordance with one or more embodiments or any of the method embodiments above, the one or more sensor signals can include a panel current sensor signal, a voltage point of regulation sensor signal, and a generator current sensor signal.

In accordance with one or more embodiments or any of the method embodiments above, the controller can include a generator controller.

In accordance with one or more embodiments or any of the method embodiments above, the generator and the one or more generator feeders can be located on a wing of an aircraft.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
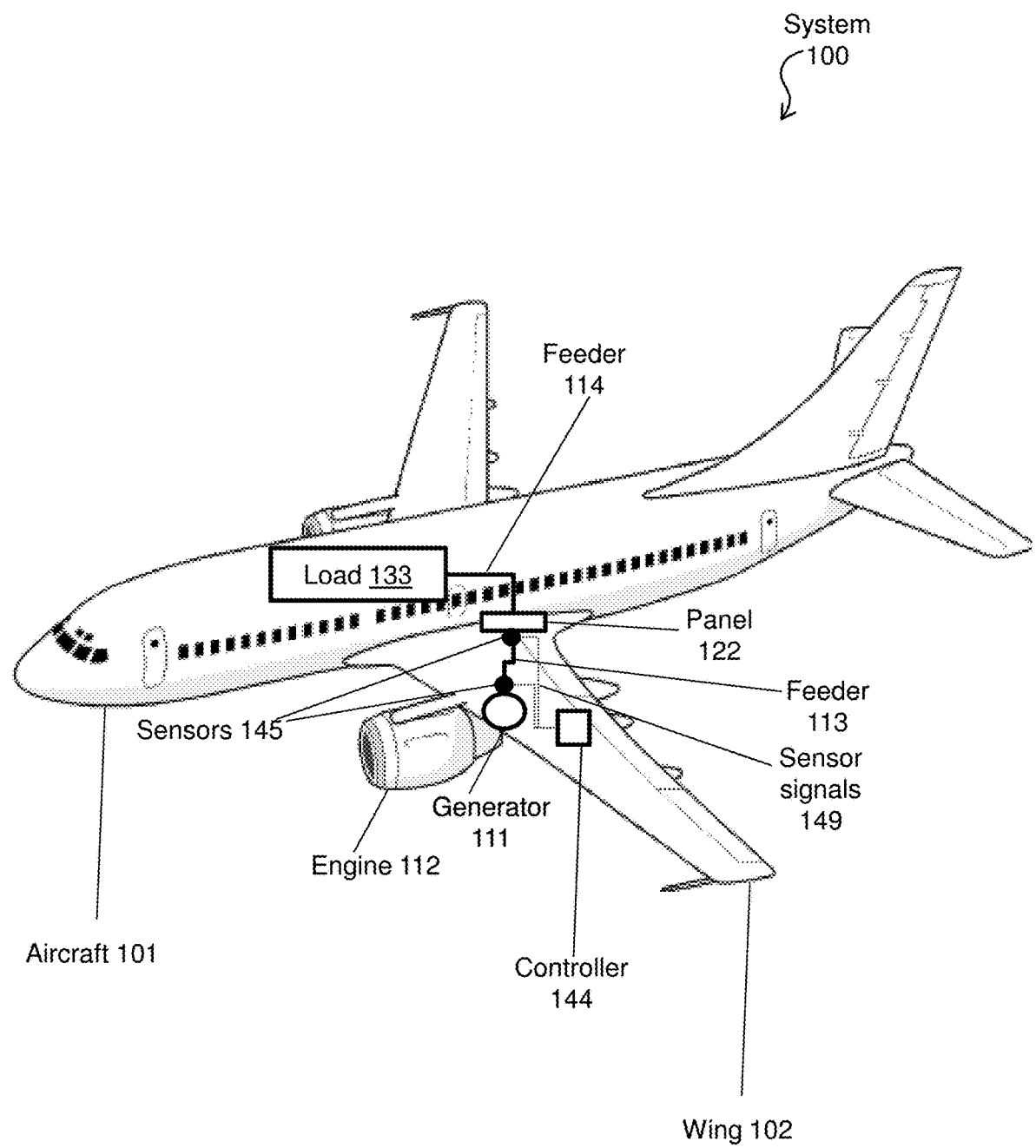
FIG. 1 depicts a system according to one or more embodiments.

FIG. 1 depicts a system 100 of an aircraft 101 (e.g., an airplane including wings 102). The aircraft 101 can be any vehicle that is able to fly by gaining support from air to counter gravity through static lift, dynamic lift, and/or downward thrust. The wings 102 are airfoils that helps lift the 'heavier-than-air aircraft' 101.

The system 100, within the aircraft 101 also provides including a generator 111. The generator 111 can be located on the wing 102 of the aircraft 103, oriented with respect to an engine 112. The engine 112 can be a source of mechanical energy, examples of which include at least gas and jet turbine engines. The generator 111 can be any device that converts motive power (e.g., mechanical energy from the engine 112) into electrical power for use in an external circuit (e.g., the system 100 of the aircraft 101).

One or more generator/panel feeders 113, 114 (e.g., electrical wires and/or conductors) provide electrical leads from the generator 111 throughout the aircraft 101. As shown, the one or more generator feeders 113 can be connected (via generator line contactors) to a panel 122 of the aircraft 101 that further supports one or more loads 133 through one or more panel feeders 114. The panel 122 (e.g., a panelboard, a breaker panel, an electric panel, etc.) can be a distribution board that divides the electrical power fed from the generator 111 into subsidiary circuits, while providing a protective fuse, a generator line contactor, and/or a circuit breaker for each circuit in a common enclosure. The load 133 can be any electrical component (e.g., lights or actuators) or portion of a circuit or the subsidiary circuits that consumes the electric power from the generator 111.

In many cases, the generator 111 and the one or more generator feeders 113 are located on the wing 102. Given that fuel is stored in and running through the wing 102, it is critically important for the system 101 to detect if there is a short circuit fault along a zone of the wing 102 (e.g., an arc zone fault). Herein disclosed is a system 100 that utilizes a controller 144 to differentiate between a fault in the panel 122 or load feeder 114 and a fault on the one or more generator feeders 113. As shown, the controller 144 is communicatively coupled (e.g., via wired or wireless mechanisms) to one or more sensors 145 to receive one or more sensor signals 149.

The controller 144 can be an electronic, computer framework comprising and/or employing any number and combination of computing device and networks utilizing various communication technologies, as described herein. The controller 144 can be easily scalable, extensible, and modular, with the ability to change to different services or reconfigure some features independently of others. In accordance with one or more embodiments, the controller 144 can be a generator controller that manages the operation of the generator 111. In accordance with one or more embodiments, the controller 144 can be a distinct electronic, computer framework that is either separate from the generator controller or incorporated therein. For example, the controller 144 can be discrete circuitry, such as a field programmable gate array, and/or the controller 144 can include a processor, also referred to as a processing circuit, microprocessor, computing unit, coupled via a bus to a memory and various other components. The controller 144 can be referred to as a protection controller.

The one or more sensors 145 can include any transducer that detects/measures a condition and converts that condition into the one or more sensor signals 149. In accordance with one or more embodiments, the one or more sensors 145 can be current sensors that detect electric current in a wire and generate a signal (e.g., the one or more sensor signals 149) proportional to that current. Examples of the one or more sensors 145 include hall effect sensor, transformers, current clamp meters, fluxgate transformer type sensors, resistors, fiber optic current sensor, Rogowski coil, etc. The one or more sensor signals 149 can be analog voltage or current or a digital output sent to the controller 144 via wired or wireless mechanisms. The one or more sensor signals 149 can be then used to display a measured current by the controller 111, stored for further analysis, or used for the purpose of control.

Figure 2:
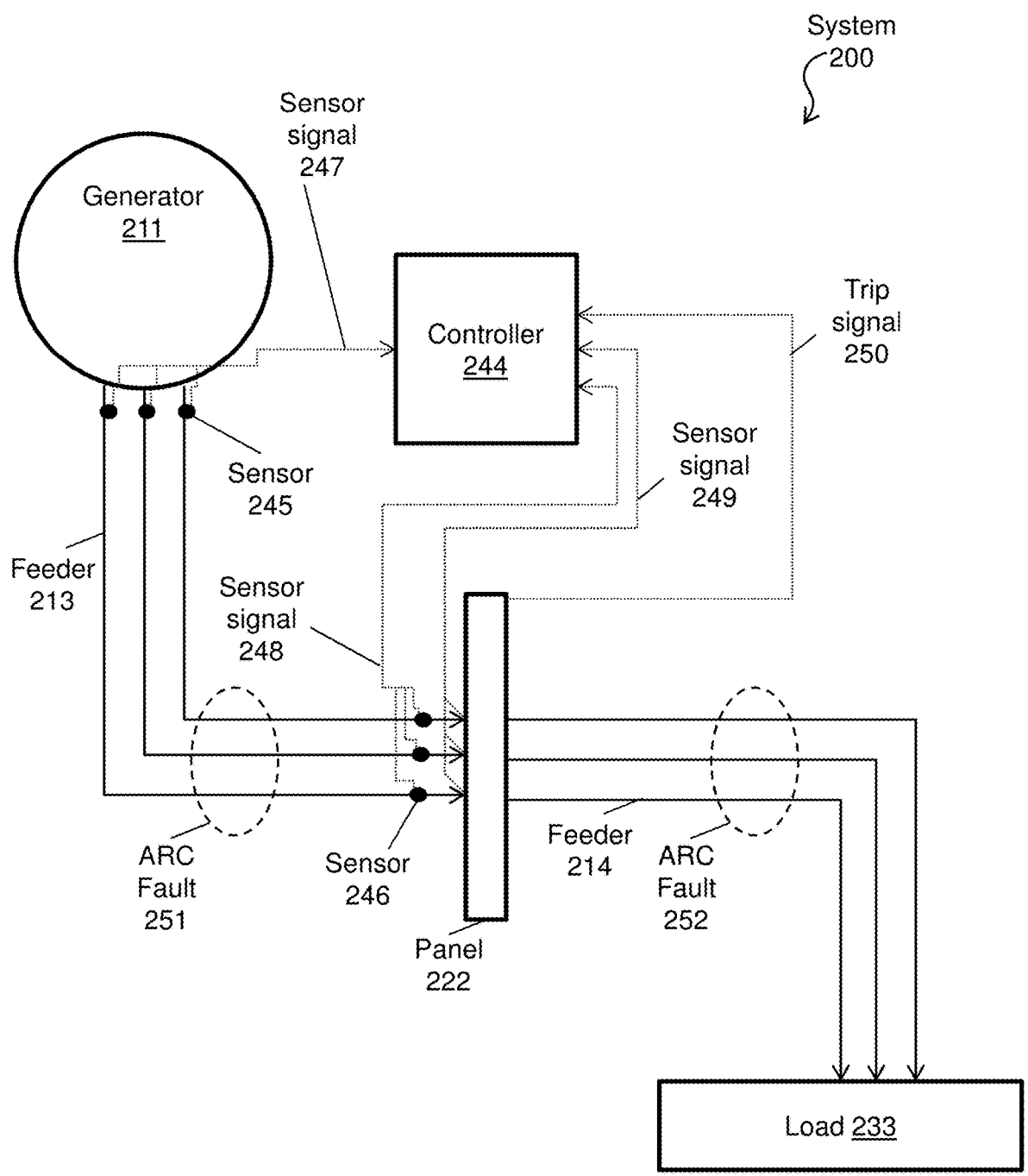
FIG. 2 depicts a system according to one or more embodiments.

Turning to FIG. 2, a system 200 is depicted according to one or more embodiments. The system 200 includes a generator 211, one or more feeders 213, 214, a panel 222, a load 233, a controller 244, sensors 245, 246, one or more sensor signals 247, 248, 249, and a trip signal 250. The system 200 is a more granular example of electrical portion the system 100. In this regard, while different numerical identifiers are utilized for the components of system 200, any components that are similar to the components of system 100 are not reintroduced for ease of explanation. Further, while each component of both systems 100, 200 may be shown as a single item, circle, block etc., these single depictions are representative of one or more items. In operation, the system 200 utilizes system currents and voltages to differentiate between a fault upstream of the generator line contactor in the panel 222 (e.g., arc fault 251) and a fault downstream of the generator line contactor (e.g., arc fault 252).

Figure 3:
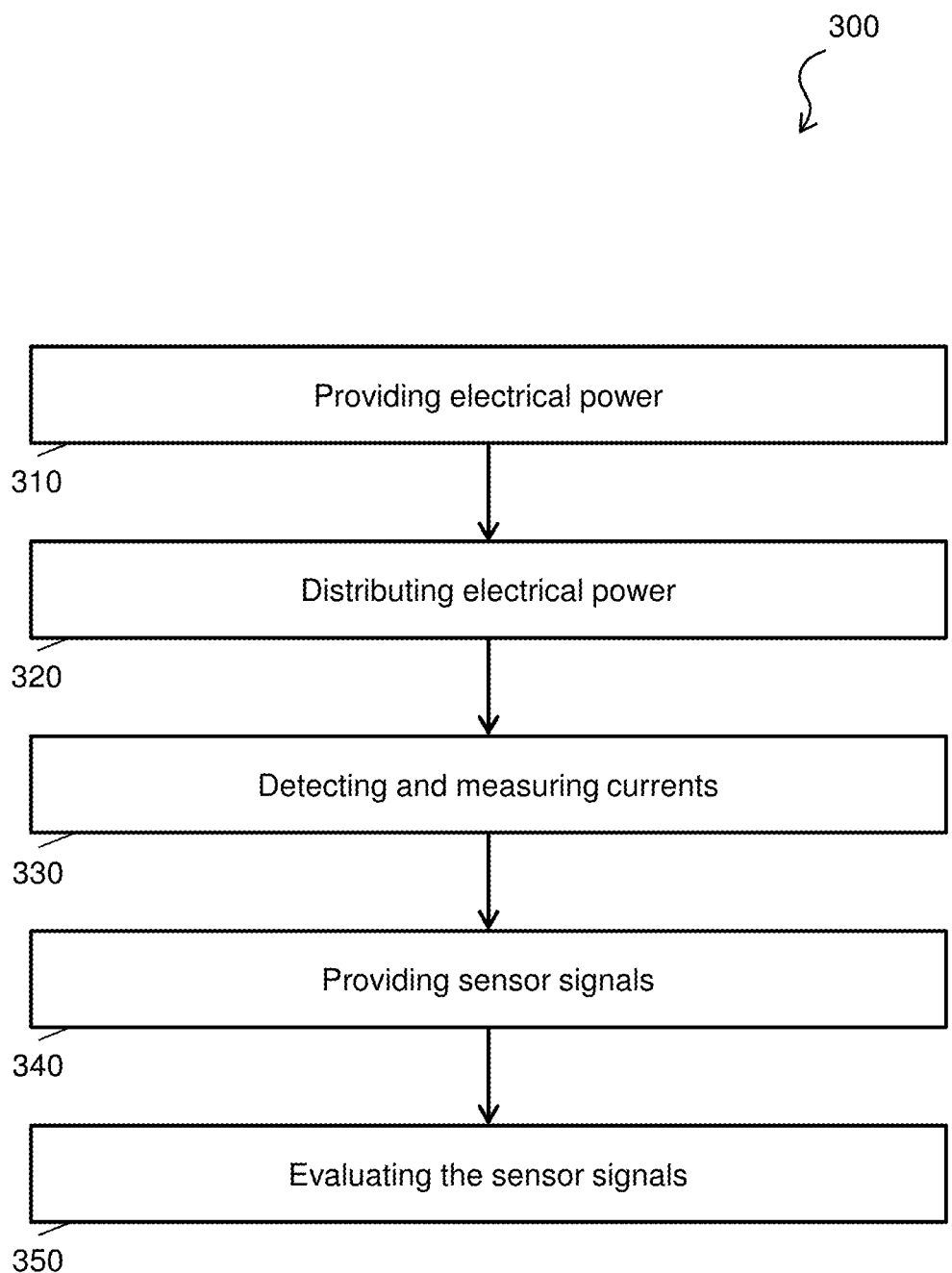
FIG. 3 depicts a process flow according to one or more embodiments.

FIG. 3 depicts a process flow 300 according to one or more embodiments The process flow 300 is an example operation of the system 200 to differentiate between arc zone faults that are upstream and downstream of the generator line contactor. In general, the process flow 300 vs. a method to calculate an impedance at a point of regulation using a line to neutral voltage and line currents.

At block 310, the generator 211 provides electrical power to the system 200 via the one or more generator feeders 213. At block 320, the panel 222 distributes the electrical power to the load 233 via the one or more panel feeders 214.

At block 330, the sensors 245, 246 detect and measure currents on the one or more feeders 213, 214. At block 340, the sensors 245, 246 provide one or more sensor signals 247, 248, 249 to the controller 211. The sensor signal 247 includes a panel current sensor signal, the sensor signal 248 includes a voltage point of regulation sensor signal, and the sensor signal 249 includes a generator current sensor signal. Note that the point of regulation is a location within the panel 222 that mitigates the fault, such as by tripping a circuit breaker. The operations of blocks 330 and 340 can be executed separates, simultaneously, continuously, at predetermined intervals (e.g., five seconds), or upon detection of an arc zone fault.

At block 350, the controller 211 evaluates and combines the one or more sensor signals 247, 248, 249 with a trip signal 250 to determine fault location (e.g., differentiate between faults that are upstream vs. downstream of the generator line contactor). For instance, upon receiving the trip signal 250, the controller 211 can utilize Equation 1 to determine the fault location, where VPOR is the voltage at the point of regulation (e.g., the sensor signal 247), Iline is the current on the line associated with the point of regulation (e.g. the panel current sensor signal 248), and Z is the per phase impedance.

$$\frac{VPOR}{ILine} = Z \quad \text{Equation 1}$$

$$Iline - Avg(IlineA, IlineB, IlineC) = Idfa \quad \text{Equation 2}$$

The per phase impedance reflects the source impedance for the panel or load wiring fault and reflects the load impedance for a differential feeder fault. In this regard, using Equation 1, the controller 211 determines an arc fault 251 based on an impedance lower than a threshold Zset (Z<Zset) and an arc fault 252 based on an impedance Z higher than a threshold Zset (Z>Zset). The Zset is determined based on generator source impedance and expected fault current magnitude. A further refinement of the algorithm incorporates a difference from an average current (Idfa) for the faulted phase (as seen in Equation 2). If Idfa is negative (e.g., Phase C current lower due to lower Phase C voltage) the fault is determined to be arc fault 251. An arc fault 252 is determined based on a difference from average current positive (e.g., Phase C current higher to reduce Phase C voltage).

In accordance with one or more embodiments, the controller 211 can set a threshold to automatically differentiate the fault location.

The technical effects and benefits of embodiments herein include detecting cascading source trips, which is a safety issue on aircraft, from a single fault, as conventional aircraft electrical systems do not include a method for isolating faults to a bus if there is an arc fault in an electrical panel that causes a trip of the differential protection. In this regard, embodiments herein correctly annunciate a fault in a generator feeder as a differential protection fault.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A system comprising:
    one or more feeders connecting a panel to a generator and a load;
    one or more sensors configured on the one or more feeders;
    a controller receiving one or more sensor signals from the one or more sensors, the controller evaluating the one or more sensor signals to determine a fault location,
    wherein the controller differentiates between a fault upstream of a generator line contactor in the panel and a fault downstream of the generator line contactor,
    wherein the controller determines the fault location by dividing a voltage at a point of regulation by a current on a line associated with the point of regulation to determine an impedance that reflects the fault location,
    wherein the point of regulation is a location within the panel that mitigates a fault.

2. The system of claim 1, wherein the controller evaluates and combines the one or more sensor signals with a trip signal to determine the fault location.

3. The system of claim 1, wherein the one or more feeders comprise one or more generator feeders connecting the panel to the generator.

4. The system of claim 3, wherein the one or more sensors comprises one or more current sensors, each of which is associated with the one or more generator feeders.

5. The system of claim 3, wherein the one or more feeders comprise one or more panel feeders connecting the panel to the load.

6. The system of claim 1, wherein the one or more sensor signals comprises a panel current sensor signal, a voltage point of regulation sensor signal, and a generator current sensor signal.

7. The system of claim 1, wherein the controller comprises a generator controller.

8. The system of claim 1, wherein the generator and the one or more generator feeders are located on a wing of an aircraft.

9. A method comprising:
    receiving, by a controller, one or more sensor signals from one or more sensors configured on the one or more feeders connecting a panel to a generator and a load; and
    evaluating, by the controller, the one or more sensor signals to determine a fault location,
    wherein the controller differentiates between a fault upstream of a generator line contactor in the panel and a fault downstream of the generator line contactor, and
    wherein the controller determines the fault location by dividing a voltage at the point of regulation by a current on a line associated with the point of regulation to determine an impedance that reflects the fault location,
    wherein the point of regulation is a location within the panel that mitigates a fault.

10. The method of claim 9, wherein the controller evaluates and combines the one or more sensor signals with a trip signal to determine the fault location.

11. The method of claim 9, wherein the one or more feeders comprise one or more generator feeders connecting the panel to the generator.

12. The method of claim 11, wherein the one or more sensors comprises one or more current sensors, each of which is associated with the one or more generator feeders.

13. The method of claim 11, wherein the one or more feeders comprise one or more panel feeders connecting the panel to the load.

14. The method of claim 9, wherein the one or more sensor signals comprises a panel current sensor signal, a voltage point of regulation sensor signal, and a generator current sensor signal.

15. The method of claim 9, wherein the controller comprises a generator controller.

16. The method of claim 9, wherein the generator and the one or more generator feeders are located on a wing of an aircraft.

* * * * *